PUSH-PULL AMPLIFIERS

Filed Aug. 19, 1966

INVENTOR.
HERMAN J. ECKELMANN, JR.
BY Auslander & Thomas
ATTORNEYS.

INVENTOR.
HERMAN J. ECKELMANN, JR.
BY Auslander & Thomas
ATTORNEYS.

United States Patent Office 3,434,067
Patented Mar. 18, 1969

3,434,067

PUSH-PULL AMPLIFIERS

Herman J. Eckelmann, Jr., 117 Christopher Circle, Ithaca, N.Y. 14850

Filed Aug. 19, 1966, Ser. No. 573,592
U.S. Cl. 330—15 7 Claims
Int. Cl. H03f 3/18, 3/26, 3/68

ABSTRACT OF THE DISCLOSURE

A pair of opposite type transistors are connected in series with the collectors in junction, and with the emitters connected to proper polarities in an external energizing circuit, and with a normally balanced input to permit free flow swing of either transistor according to signal input polarity. The balanced input provides a neutral point for a feed-back connection.

This driver circuit provides a high impedance input current source to drive an unbiased push pull complementary output stage, and eliminates coupling transformers.

This invention relates to amplifiers. More particularly, it relates to "push-pull" transistor amplifier circuits characterized by improved efficiency in the output drive required therefor.

In one form of a known transistor "push-pull" amplifier circuit, a phase inverting driver is required. Such driver may be a transformer, an additional transistor circuit, or a low gain phase splitter. Where the transformer is employed, there are introduced phase shifts which limit band width and feedback level. In addition, the positioning or emplacement of the transformer has to be effected carefully to hold the magnetic pickup to an acceptable level. Of course, the use of a transformer introduces the undesirable elements of extra weight, space consumption and cost. In this type of circuit, biasing to effect temperature compensation is required in the output stage. The quiescent current requirements to achieve acceptable distortion limits the life of a battery where the amplifier is employed in portable equipment and such type of transformer driven amplifier is not readily and economically adaptable to integrated circuit type mass production techniques.

In another form of known transistor "push-pull" amplifier, a pair of transistors operated in the class B mode and arranged in complementary symmetry are utilized as the amplifier. In this type of circuit crossover distortion is substantially reduced by employing a high impedance driver and negative feedback. However, a driver transformer is still required which introduces the disadvantages inherent in the use thereof, i.e., the restriction of permissible feedback by bandwidth limitations and the magnetic induced hum pickup. The distortion and other effects caused by the use of the transformer have to be reduced by balancing the DC in the primary of the transformer.

In yet another type of circuit, the output transformer is eliminated and a modified "push-pull" circuit is used. However, a driver transformer has to be employed to effect phase inversion with the accompanying disadvantages of bandwidth restriction and the consequent feedback limitation, and magnetic hum pickup. In this type of circuit, in addition, the standby power wastage is improved and the temperature compensation of bias is still required.

Push-pull amplifiers are known in which there are employed a complementary symmetry arrangement of transistors. However, such circuits while eliminating the disadvantages presented in the employment of transformers still require a standing current large enough to place the circuit into the linear operating range of the transistors. Thus, such circuits lack battery economy during small signal or low volume operation and, in practical use, also require temperature compensation.

Accordingly, it is an important object of this invention to provide a "push-pull" transistor amplifier circuit in which there are eliminated both the needs for a driver and an output transformer, thereby eliminating the limitations and disadvantages and distortion introduced by the use of such transformers and in which there is provided a desirably high impedance drive to further minimize such distortion.

It is another object to provide an amplifier circuit in accordance with the preceding object wherein, when it is powered by a portable unidirectional source such as a battery, the standby power drain is reduced to a very low or substantially zero value.

It is a further object to provide a circuit in accordance with the preceding objects which lends itself readily to integrated circuit-type mass production.

Generally speaking, and in accordance with the invention, there is provided a "push-pull" transistor amplifier comprising a driver stage and an output stage. The driver stage comprises a first pair of different type transistors connected in complementary symmetry, each of these transistors comprising emitter, base and collector electrodes, the emitters of these transistors being adapted to be connected to the opposite terminals of a unidirectional potential source, the collectors of these transistors being connected to each other whereby the collectors of the transistors respectively function as the loads for each other to produce a current source at the junction of the collectors. The output stage comprises a second pair of different type transistors connected in complementary symmetry and respectively adapted to be connected to the opposite terminals of the source, and connected to the junction.

For a better understanding of the invention, together with other and further objects thereof, reference is had to the following description taken in conjunction with the accompanying drawing and its scope is pointed out in the appended claims.

In the drawing, FIG. 1 is a schematic diagram of an illustrative embodiment of a circuit constructed in accordance with the principles of the invention;

Figure 1:
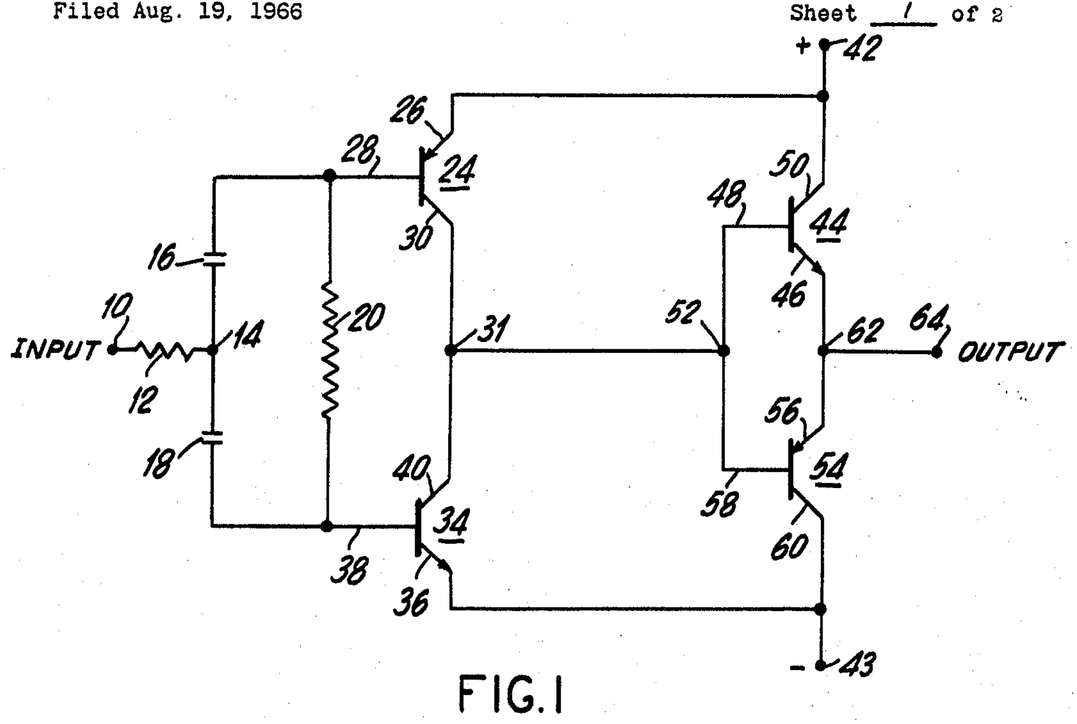

Referring now to FIG. 1, there is schematically depicted therein a transistor "push-pull" amplifier circuit constructed in accordance with the principles of the invention, and notable for use as an audio power amplifier in portable audio equipment. The input to the amplifier is applied at the input terminal 10 to point 14 through a resistor 12. The signal appearing at point 14 is applied to the base 28 of a transistor 24 through a capacitor 16 and to the base 38 of a transistor 34 through a capacitor 18. Transistors 24 and 34 are chosen to be of different types so as to provide a complementary symmetry arrangement, transistor 24 being of the PNP type and transistor 34 being of the NPN type. The emitter 26 of transistor 24 is connected directly to the positive terminal 42 of a unidirectional potential source and the emitter 36 of transistor 34 is connected to the negative terminal 43 of the source, the source, where portable equipment is employed, suitably being a battery. The collectors 30 and 40 of transistors 24 and 34 respectively are connected to a common output point 31.

The output appearing at point 31 is applied through point 52 to the base 48 of a transistor 44 and the base 58 of a transistor 54. In transistor 44, the collector 50 is connected to terminal 42 and the emitter 46 is connected through point 62 to the output point 64 of the circuit. Correspondingly, in transistor 54, the collector 60 is connected to negative terminal 43 of the sound and the emitter 56 is connected to point 64 through point 62. Transistors 44 and 54 are also chosen to be of different type transistors which are arranged in complementary symmetry, i.e., transistor 44 is of the NPN type and transistor 54 is of the PNP type. It is also to be noted that adjacent transistors, i.e., transistors 24 and 44 and transistors 34 and 54 are also of different types. A resistor 20 is connected between base electrodes 28 and 38.

In considering the operation of the circuit shown in FIG. 1, it is noted that in the driver portion thereof, viz., that comprising the complementary symmetry arrangement of transistors 24 and 34, the collector of one of these transistors is the load of the other of these transistors. It is realized that were resistive loads to be used for transistors 24 and 34, the output at point 31 would essentially be a voltage source. However, in the arrangement shown in FIG. 1 wherein the near infinite collector impedance of the driver transistor to respectively load each other, there is provided instead of a voltage source, a current source which can directly drive an unbiased push-pull complementary output stage. Thus, a zero signal fed to the balance drivers delivers a zero signal to the output stage which then has zero standing current with its concomitant economical lack of consumption of source power. Thus, with the circuit of FIG. 1, the power is used only to produce an audio output and is not employed to compensate for crossover distortion.

It is thus seen that with the circuit of FIG. 1, both the driver and output transformers are eliminated. The use of emitter follower arrangements in the output stage allows a desirably higher impedance drive thereof which further decreases crossover distortion and the problem of bias drift with temperature does not exist, yet output impedance is desirably low. The standby power drain of the circuit is substantially zero and of course the circuit is readily adaptable to integrated circuit type mass production.

Figure 2:
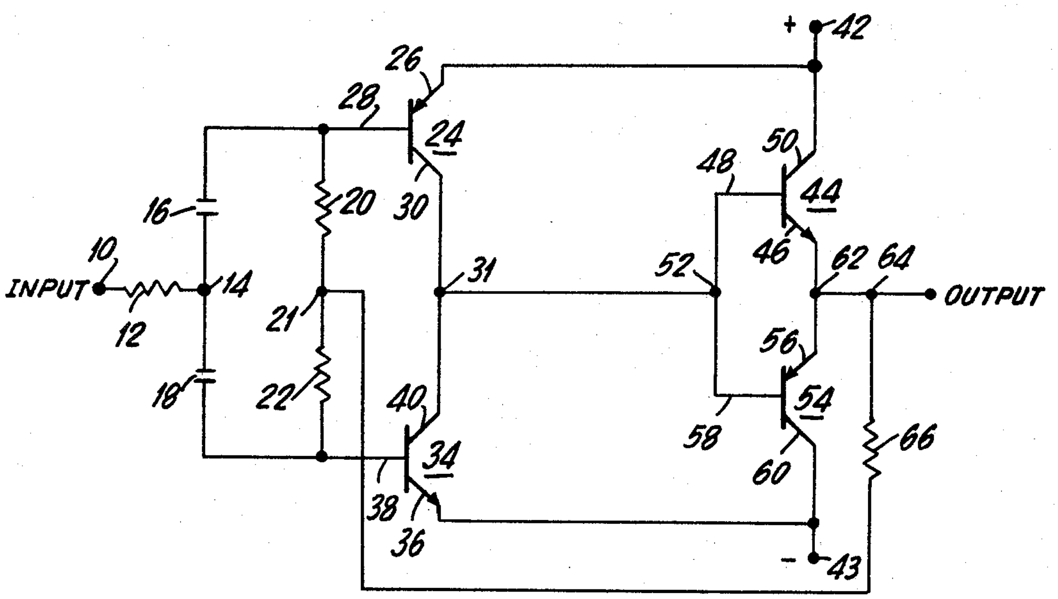
FIG. 2 is a diagram of a circuit which is a modification of that shown in FIG. 1.

FIG. 2 shows a circuit essentially similar to that of FIG. 1 with the difference of a series arrangement of resistors 20 and 22 replacing resistor 20, and the connection of point 64 to the junction point 21 of resistors 20 and 22 through a resistor 66. With this arrangement there is effected negative feedback by providing a feedback resistor between output point 64 and junction point 21.

Figure 3:
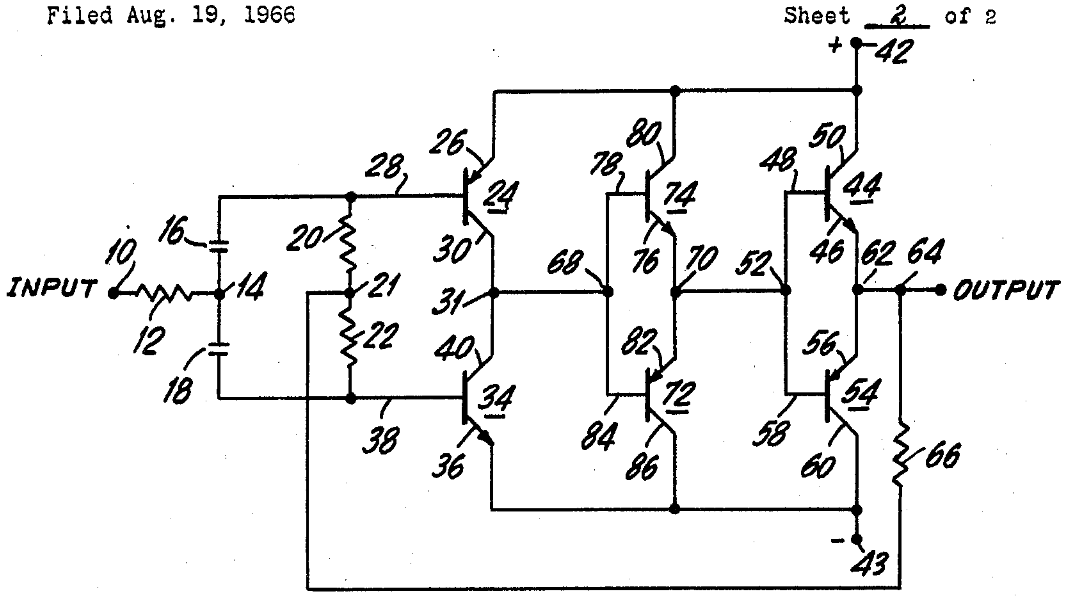
FIG. 3 is a diagram of a circuit which is a modification of that shown in FIG. 2.

The circuit shown in FIG. 3 is essentially similar to that shown in FIG. 2 whereby the same designating numerals have been used for corresponding structures. In addition, this circuit includes a second output stage comprising complementary symmetry arranged emitter follower transistors 74 and 72. In transistor 74, which is of the same type as transistor 44, the base 78 is connected to point 31 through point 68, the collector 80 is connected to the positive terminal 42 and the output emitter is connected to point 52 through point 70. In transistor 72, which is of the same type as transistor 54, the base 84 is connected to point 31 through point 68, the collector 86 is connected to the negative terminal 43 of the source and the emitter is connected to point 52 through point 70.

The inclusion of the complementary symmetry emitter follower arrangement of transistors 74 and 72 in the circuit of FIG. 3 gives it a greater output capability. It is to be noted that as in the circuit of FIG. 2, the zero bias coupling method is used, i.e., transistors 74 and 72 and not a so-called Darlington pair with the latters' usual standing current.

Figure 4:
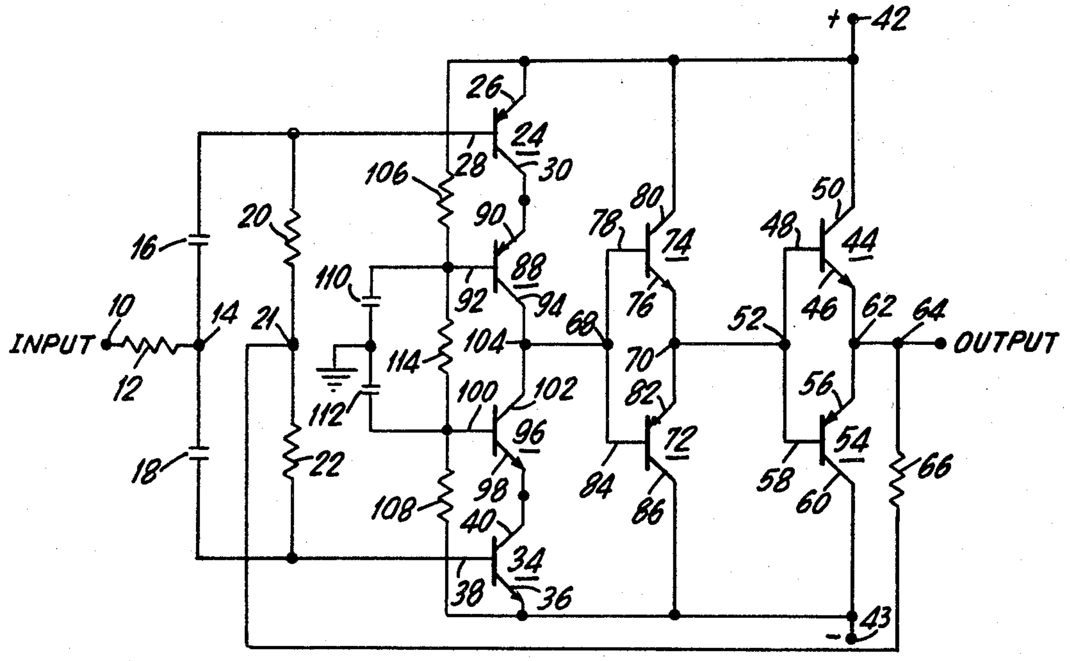
FIG. 4 is a diagram of a circuit which is a modification of that shown in FIG. 3.

The circuit shown in FIG. 4 is essentially similar to that depicted in FIG. 3 and accordingly, the same numerals have been employed to designate corresponding structures. The difference between the circuits of FIGS. 3 and 4 is that the driver stage in the circuit comprises a pair of grounded base complementary transistors which are respectively driven by each of a pair of conventional complementary transistors. With each arrangement, there is enabled a closer approximation of a current source for driving the output stages.

Thus, referring to FIG. 4, in grounded base transistor 88, the emitter 90 is connected to collector 30 of transistor 24, the base 92 is connected to the positive terminal 42 of the source through a resistor 106, to ground through a capacitor 110 and to base 100 through a resistor 114. The collector 102 of grounded base transistor 96 is connected to point 68 through point 104. The remaining circuitry of transistor 96 is symmetrical to that of transistor 88.

It is seen in FIG. 4 that PNP transistor 24 drives grounded base PNP transistor 88 and that NPN transistor 34 drives grounded base NPN transistor 96. With this arrangement, there is provided a grounded base driver stage. The driver stage output point 104 is then substantially purely a current source.

It is to be understood that the transistors in the output stage can readily be replaced by Darlington pairs to enhance the output power capabilities of the inventive circuit. It is to be appreciated that the circuit in accordance with the invention is an improvement over Darlington output in that a zero bias output circuit having no standby or idling current is provided.

Accordingly, it is seen that with the push-pull amplifier constructed in accordance with the principles of the invention, there is achieved a current source which is employed to drive a zero biased complementarily arranged output pair or multiple of such pair. The negative feedback included in the circuit is to both compensate for lack of pair matching and to perform the general function of distortion reduction. By contrast, with known push-pull transistor amplifier circuits, to achieve the same result as the inventive circuit, there has to be employed expensive and heavy driver transformers which waste valuable source power and generate undesirable heat. The inventive circuit is simple, whereby it is readily vaccum deposited on a single chip, which is a valuable mass-production advantage in addition to the advantage presented by its efficient employment of power and its good performance. Further there is reduction of standby current in the output stage to substantially zero.

While there have been described what are considered to be preferred embodiments of this invention, it will be obvious to those skilled in the art that many changes and modifications may be made therein without departing from the invention.

Having thus described certain forms of the invention in some detail, what is claimed is:

1. A push-pull transistor amplifier comprising a driver stage and an output stage, said driver stage comprising a first pair of different type transistors connected in complementary symmetry, each of said transistors comprising emitter, base and collector electrodes, the emitters of said transistors being adapted to be connected to the opposite terminals of a unidirectional potential source, the collectors of said transistors being connected to each other whereby the collectors of said transistors respectively function as the loads for each other to produce a current source at the junction of said collectors, said output stage comprising a second pair of different type transistors connected in complementary symmetry and with their collector electrodes respectively adapted to be connected to said opposite terminals of said source, and with their base electrodes connected to said junction of the driver stage.

2. A push-pull transistor amplifier as defined in claim 1 wherein said second pair of transistors are respectively arranged as emitter followers.

3. A push-pull transistor amplifier as defined in claim 1 and further including means for negatively feeding back the output of said second pair of transistors to said first pair of transistor, to fix the amplifiers' output quiescent voltage midway between the terminal voltages of the potential supply source, and thus permit equally large positive and negative signal excursions at the input.

4. A push-pull transistor amplifier as defined in claim 1 and further including a third pair of transistors arranged in complementary symmetry, said third pair being connected to be driven by the output of the second pair at the junction of said second pair of emitter electrodes connected to the junction of the base electrodes of said third pair of transistors, for producing a lower final output impedance and thereby permitting greater output power.

5. A push-pull transistor amplifier as defined in claim 4 wherein the respective transistors of said second and third pairs are arranged as emitter followers.

6. A push-pull amplifier as defined in claim 1 and further including an auxiliary pair of grounded base complementary symmetry arranged different type transistors in said driver stage to increase the impedance of said driver stage and disposed intermediate the first mentioned input pair in said driver stage, with the emitter electrodes of the auxiliary pair connected to the collector electrodes of the input transistors to receive the input signals in said auxiliary pair for transmission to the following stage.

7. A push-pull transistor as defined in claim 5 and including an auxiliary pair of grounded base complementary symmetry arranged different type transistors in said driver stage, each of the transistors of said auxiliary pair being connected to be driven by a respectively like type transistor in said first-mentioned input pair.

References Cited

UNITED STATES PATENTS

| | | | |
|---|---|---|---|
| 2,860,195 | 11/1958 | Stanley | 330—13 |
| 2,981,895 | 4/1961 | Koch | 330—18 |
| 2,994,834 | 8/1961 | Jones | 330—13 X |

ROY LAKE, *Primary Examiner.*

JAMES B. MULLINS, *Assistant Examiner.*

U.S. Cl. X.R.

330—25, 18, 19, 20, 17